United States Patent
Denisenko

(10) Patent No.: US 10,558,437 B1
(45) Date of Patent: Feb. 11, 2020

(54) METHOD AND APPARATUS FOR PERFORMING PROFILE GUIDED OPTIMIZATION FOR HIGH-LEVEL SYNTHESIS

(71) Applicant: Altera Corporation, San Jose, CA (US)

(72) Inventor: Dmitry N. Denisenko, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/746,518

(22) Filed: Jan. 22, 2013

(51) Int. Cl.
*G06F 8/41* (2018.01)

(52) U.S. Cl.
CPC .................... *G06F 8/443* (2013.01)

(58) Field of Classification Search
None
See application file for complete search history.

(56) References Cited

U.S. PATENT DOCUMENTS

| | | | | |
|---|---|---|---|---|
| 5,179,702 A * | 1/1993 | Spix | ................ | G06F 8/41 718/102 |
| 5,966,538 A * | 10/1999 | Granston | ................ | G06F 8/443 717/158 |
| 6,226,776 B1 * | 5/2001 | Panchul | ................ | G06F 17/5045 716/102 |
| 6,360,356 B1 * | 3/2002 | Eng | ................ | G06F 17/5045 716/105 |
| 6,438,537 B1 * | 8/2002 | Netz | ................ | G06F 16/283 |
| 6,477,683 B1 * | 11/2002 | Killian | ................ | G06F 17/5045 716/104 |
| 6,745,160 B1 | 6/2004 | Ashar et al. | | |
| 6,763,506 B1 * | 7/2004 | Betz | ................ | G06F 17/5031 438/129 |
| 6,848,085 B2 * | 1/2005 | Panchul | ................ | G06F 17/5045 716/102 |
| 6,862,563 B1 * | 3/2005 | Hakewill | ................ | G06F 9/30145 703/13 |
| 6,952,817 B1 * | 10/2005 | Harris | ................ | G06F 17/505 716/103 |
| 6,978,231 B2 * | 12/2005 | Williams | ................ | G06F 8/43 703/13 |
| 7,111,274 B1 * | 9/2006 | Edwards | ................ | G06F 17/5045 716/103 |
| 7,234,126 B2 * | 6/2007 | Catthoor | ................ | G06F 17/5045 716/104 |

(Continued)

FOREIGN PATENT DOCUMENTS

EP      1159693 A2 * 12/2001 ......... G06F 17/5045

OTHER PUBLICATIONS

Calibre CMPAnalyzer—Located at http://www.mentor.com/products/ic_nanometer_design/design-for-manufacturing/calibre-cmp-analyzer/ 2015.*

(Continued)

*Primary Examiner* — Hossain M Morshed

(57) ABSTRACT

A method for designing a system on a target device includes performing a high-level compilation of a computer program language description of the system to generate a hardware description language (HDL) of the system. The high-level compilation performs optimizations in response to profile data obtained from an earlier compilation of the system.

21 Claims, 9 Drawing Sheets

(56) References Cited

U.S. PATENT DOCUMENTS

| | | | | |
|---|---|---|---|---|
| 7,290,239 | B1* | 10/2007 | Singh | G06F 17/5054 716/104 |
| 7,334,114 | B2 | 2/2008 | Sohm et al. | |
| 7,370,311 | B1* | 5/2008 | Pritchard | G06F 17/505 703/13 |
| 7,483,913 | B2* | 1/2009 | Hekmatpour | G06F 17/50 707/999.102 |
| 7,703,085 | B2* | 4/2010 | Poznanovic | G06F 17/5045 717/140 |
| 7,765,547 | B2* | 7/2010 | Cismas | G06F 9/3851 712/214 |
| 7,770,163 | B2* | 8/2010 | Stoodley | G06F 8/443 717/130 |
| 7,823,117 | B1* | 10/2010 | Bennett | G06F 17/5054 703/13 |
| 7,849,465 | B2* | 12/2010 | Zou | G06F 9/3009 710/260 |
| 8,001,499 | B1* | 8/2011 | Baeckler | G06F 17/5054 716/101 |
| 8,352,898 | B1* | 1/2013 | Kellermann | G06F 17/5054 716/116 |
| 8,621,468 | B2* | 12/2013 | Bendapudi | G06F 8/443 717/127 |
| 2003/0066060 | A1* | 4/2003 | Ford | G06F 8/443 717/158 |
| 2003/0079214 | A1* | 4/2003 | Ghobrial | G06F 8/443 717/158 |
| 2003/0191869 | A1 | 10/2003 | Williams et al. | |
| 2003/0237078 | A1 | 12/2003 | Williams et al. | |
| 2004/0019859 | A1* | 1/2004 | Ravi | G06F 17/5022 716/103 |
| 2004/0098701 | A1* | 5/2004 | Klein | G06F 17/5022 716/103 |
| 2004/0154019 | A1* | 8/2004 | Aamodt | G06F 9/3009 718/102 |
| 2005/0125784 | A1* | 6/2005 | Yang | G06F 11/3419 717/158 |
| 2005/0149313 | A1 | 7/2005 | Roesner et al. | |
| 2005/0149697 | A1* | 7/2005 | Enright | G06F 9/3009 712/214 |
| 2005/0149915 | A1* | 7/2005 | Wu | G06F 9/45516 717/137 |
| 2005/0160139 | A1 | 7/2005 | Boucher et al. | |
| 2005/0193280 | A1 | 9/2005 | Schubert et al. | |
| 2005/0268269 | A1* | 12/2005 | Coiley | G06F 17/5031 716/113 |
| 2005/0289485 | A1* | 12/2005 | Willis | G01R 31/318364 716/104 |
| 2006/0259164 | A1 | 11/2006 | Swoboda | |
| 2007/0214342 | A1* | 9/2007 | Newburn | G06F 11/348 712/216 |
| 2007/0256046 | A1* | 11/2007 | Pikus | G06F 17/5068 716/54 |
| 2008/0040715 | A1 | 2/2008 | Cota-Robles et al. | |
| 2008/0066046 | A1* | 3/2008 | Ogilvie | G06F 17/5045 716/102 |
| 2008/0177756 | A1* | 7/2008 | Kosche | G06F 11/3447 |
| 2008/0276020 | A1 | 11/2008 | Ching et al. | |
| 2009/0055784 | A1* | 2/2009 | Izumi | G06F 17/5027 716/106 |
| 2009/0276758 | A1* | 11/2009 | Song | G06F 8/456 717/124 |
| 2011/0154289 | A1* | 6/2011 | Mannarswamy | G06F 8/4442 717/106 |
| 2011/0167416 | A1* | 7/2011 | Sager | G06F 8/4442 717/149 |
| 2011/0219208 | A1 | 9/2011 | Asaad et al. | |
| 2012/0284501 | A1* | 11/2012 | Zievers | G06F 17/5027 713/100 |
| 2013/0086568 | A1* | 4/2013 | Krishnamurthy | G06F 9/4493 717/154 |
| 2013/0125074 | A1 | 5/2013 | Mansouri et al. | |
| 2013/0125097 | A1* | 5/2013 | Ebcioglu | G06F 17/5045 717/136 |
| 2013/0166886 | A1* | 6/2013 | Sasanka | G06F 9/30098 712/216 |
| 2013/0205307 | A1* | 8/2013 | Mcclain | F16L 23/036 719/320 |
| 2013/0318401 | A1* | 11/2013 | Vera | G06F 11/263 714/32 |
| 2013/0346302 | A1* | 12/2013 | Purves | G06Q 20/102 705/40 |
| 2014/0019721 | A1* | 1/2014 | Stavrou | G06F 9/3804 712/207 |
| 2014/0026111 | A1* | 1/2014 | Stitt | G06F 9/4484 717/101 |
| 2014/0089942 | A1* | 3/2014 | Newburn | G06F 11/348 719/318 |
| 2014/0208085 | A1* | 7/2014 | Chung | G06F 9/325 712/241 |
| 2017/0269978 | A1* | 9/2017 | Engel | G06F 9/541 |
| 2018/0018253 | A1* | 1/2018 | Malton | G06F 11/3604 |

OTHER PUBLICATIONS

Gartner-decision framework cost optimization ideas, 2009 located at http://eval.symantec.com/mktginfo/enterprise/other_resources/b-gartner_decision_framework_for_prioritizing_cost_optimization_ideas.en-us.pdf.*

Altera-sopc builder Guide—2010 Located at: https://www.altera.com/en_US/pdfs/literature/ug/ug_sopc_builder.pdf.*

Lindahl, "Using Hardware Trace for Performance Analysis", 2005, Dr. Dobb's, located at http://www.drdobbs.com/tools/using-hardware-trace-for-performance-ana/184406289.*

Intel, "Example of Profile-Guided Optimization", 2009, Intel Corp., located at http://www.ladon.iqfr.csic.es/intel/doc/main_for/mergedProjects/optaps_for/common/optaps_pgo_expl.htm.*

SOPC-Builder, "SOPC Builder User Guide", 2010, Altera, located at https://www.altera.com/en_US/pdfs/literature/ug/ug_sopc_builder.pdf.*

Xilinx, "Synthesis Options", 2008, Xilinx Inc., located at https://www.xilinx.com/itp/xilinx10/isehelp/pp_db_xst_synthesis_options.htm.*

MSDN, "Introduction to Instrumentation and Tracing", 2003, Microsoft, located at: https://msdn.microsoft.com/en-us/library/x5952w0c(v=vs.100).aspx.*

Altera_sopc_Builder—2010, Published by Altera located at: https://www.altera.com/en_US/pdfs/literature/ug/ug_sopc_builder.pdf.*

Lindahl-Using Hardware Trace for perf analysis—2005, located at: http://www.drdobbs.com/tools/using-hardware-trace-for-performance-ana/184406289.*

Constrained optimization, "Constrained optimization: step by step", 2013, published at https://www3.nd.edu/~jstiver/FIN360/Constrained%20Optimization.pdf.*

Dead-code-elimination, "Compiler Design Dead Code Elimination", 2015, Published by SlideShare at file:///C:/Users/hmorshed1/Downloads/compilerdesign1-151220155219.pdf.*

Pouchet, "Loop Transformations: Convexity, Pruning and Optimization", 2011, ACM, ACM 978-1-4503-0490-0/11/01.*

Programming Logic, "Programming Logic", 2018, https://en.wikiversity.org/wiki/Programming_Logic.*

StackOverflow, "What is meant by the term "Instrumentation"?", 2012, https://stackoverflow.com/questions/8755211/what-is-meant-by-the-term-instrumentation?utm_medium=organic&utm_source=google_rich_qa&utm_campaign=google_rich_qa.*

Profile Guided Optimization, "Profile Guided Optimization", 2018, Google.com.*

Computer Hope, "Data File", 2018, Published at https://www.computerhope.com/jargon/d/datafile.htm (Year: 2019).*

GNU-Octave, "GNU Octave Scientific Programming Language", 2018, published at https://www.gnu.org/software/octave/ (Year: 2018).*

MATLAB, "MATLAB Supported Interfaces to Other Languages", 2018, published at https://www.mathworks.com/support/sysreq/supported-language-interfaces.html (Year: 2018).*

(56) References Cited

OTHER PUBLICATIONS

SmartBear, "Fundamentals of Performance Profiling", 2018, published at https://smartbear.com/learn/code-profiling/fundamentals-of-performance-profiling/ (Year: 2019).*
Luitjens, "CUDA Warps and Occupancy", 2011, NVidia (Year: 2011).*
ElectricalEngineering, "What is a false path timing constraint?", 2012, Published at https://electronics.stackexchange.com/questions/39181/what-is-a-false-path-timing-constraint (Year: 2012).*
Actel, Actel Corporation, "Actel HDL Coding Style Guide", Located at https://www.microsemi.com/document-portal/doc_view/130823-hdl-coding-style-guide , 2009.
PC Magazine, "Encyclopedia", PC Magazine, located at https://www.pcmag.com/encyclopedia/term/61718/profile , 2017.
Curreri, "Performance Analysis with High-Level Languages for High-Performance Reconfigurable Computing", 2009, 16th International Symposium on Field-Programmable Custom Computing Machines, IEEE (Year: 2009).
Second Office Action for U.S. Appl. No. 14/954,923, dated Oct. 19, 2018, 40 pages.
Xilinx, "HDL Synthesis for FPGAs Design Guide", 1995, Xiilinx Inc. (Year: 1995).
Xilinx2, "Design and Reuse of Components", 2010, Xilinx Inc. (Year: 2010).

* cited by examiner

METHOD AND APPARATUS FOR PERFORMING PROFILE GUIDED OPTIMIZATION FOR HIGH-LEVEL SYNTHESIS

FIELD

Embodiments of the present invention relate to tools for designing systems on target devices. More specifically, embodiments of the present invention relate to a method and apparatus for performing profile guided optimization for high-level synthesis.

BACKGROUND

Target devices such as field programmable gate arrays (FPGAs), structured application specific integrated circuits (ASICs), and ASICs are used to implement large systems that may include million of gates and megabits of embedded memory. The complexity of a large system often requires the use of electronic design automation (EDA) tools to create and optimize a design for the system onto physical target devices.

Among the procedures performed by EDA tools in a computer aided design (CAD) compilation flow are high-level compilation and hardware description language (HDL) compilation. High-level compilation (or "high-level synthesis") involves generating an HDL of a system from a computer language description of the system. The computer language description of the system may be, for example, in Open Computing Language (OpenCL) format or another computer language description format. OpenCL is a framework for writing programs that execute across heterogeneous platforms. OpenCL includes a language for writing kernels and application programming interfaces (APIs) that are used to define and control platforms. HDL compilation involves performing synthesis, placement, routing, and timing analysis of the system on the target device.

Traditionally, high-level synthesis is performed independent of information from other compilations. As a result, the HDL compiler must compile the generated HDL from the high-level compilation in a vacuum in the best manner it can.

SUMMARY

According to embodiments of the present invention, methods and apparatus for performing profile guided optimizations for high-level synthesis are disclosed. Profile data is gathered for an earlier design of a system. The profile data is fed back to a high-level compiler to allow it to have useful statistics of the system while it makes decisions on how to optimize the design. The profile data may include information generated from a timing analysis of a hardware definition language compilation of an earlier design, and/or actual hardware profile data obtained from actual use or simulation of the system.

According to an embodiment of the present invention, a method for designing a system on a target device includes performing a high-level compilation of a computer program language description of the system to generate a hardware description language (HDL) of the system. The high-level compilation performs optimizations in response to profile data obtained from an earlier compilation of the system.

According to an embodiment of the present invention, a method for designing a system on a target device includes performing a high-level compilation of a computer program language description of the system to generate a HDL of a system. The high-level compilation adds hardware to the system for collecting hardware profile data used for future high-level compilation of the system.

According to an embodiment of the present invention, a system designer includes a high-level compiler operable to perform high-level compilation of a computer program language description of the system to generate a HDL of the system. The system designer also includes a graphical user interface operable to present a plurality of optimization options and costs and benefits associated with the optimization options, wherein the high-level compiler performs an optimization option responsive to a user selecting the optimization option.

BRIEF DESCRIPTION OF THE DRAWINGS

The features and advantages of embodiments of the present invention are illustrated by way of example and are not intended to limit the scope of the embodiments of the present invention to the particular embodiments shown.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, procedures, and programs are shown in block diagram form to avoid obscuring embodiments of the present invention unnecessarily.

Figure 1:
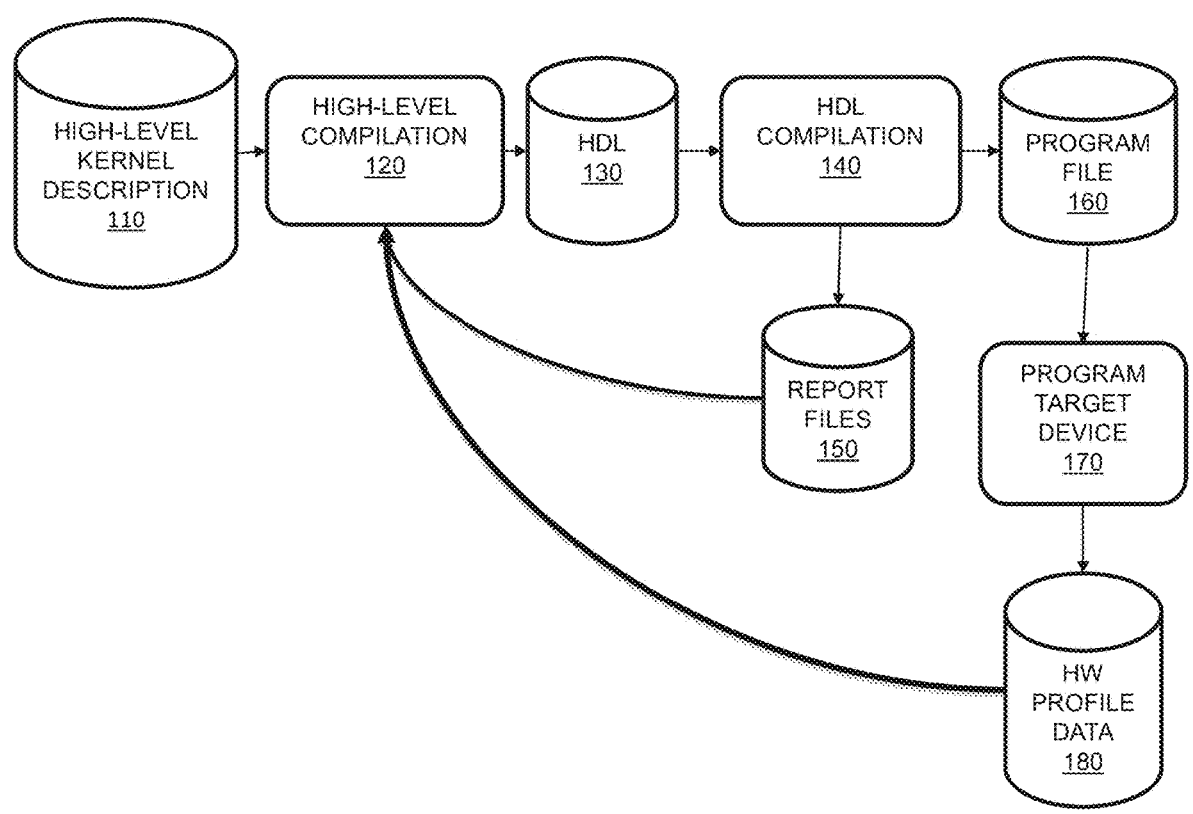
FIG. 1 is a flow chart illustrating a method for designing a system on a target device according to an exemplary embodiment of the present invention.

FIG. 1 is a flow chart illustrating a method for designing a system on a target device according to an exemplary embodiment of the present invention. The target device may be a field programmable gate array (FPGA), application specific integrated circuit (ASIC), a structured ASIC, or other device whose functionality is described by a hardware description language (HDL). According to one embodiment, the procedure illustrated in FIG. 1 may be performed by one or more computer aided design (CAD)/electronic design automation (EDA) tools implemented on a computer system.

At 120, a high-level kernel description 110 is compiled into HDL 130. According to an embodiment of the present invention, the high-level kernel description 110 may be a computer program language (high-level) description of the system such as OpenCL or other language or format. During a first iteration of high-level compilation 120, hardware is added to the design of the system for collecting hardware profile data. Hardware profile data may be collected from the added hardware when the system is running as implemented on the target device.

At 140, the HDL 130 is compiled into a program file 160. According to an embodiment of the present invention, HDL compilation involves synthesis, placement, routing, and timing analysis. Report files 150 may be generated by the HDL compilation. The report files may include statistics from the timing analysis which identify critical paths and timing information. The report files may also include information about the compiled design such as its size and location of components. For example, the report files may include a value, larea, which reflects an area required to implement the system. The report files may also include a value, lslack, which identify, for each hardware block that corresponds to a single high-level instruction, a worst slack value of a path that goes through the hardware block. A program file 160 may also be generated by the HDL compilation.

At 170, the target device is programmed using the program file 160 to implement the system. The hardware added to the system during high-level compilation 120 may be used to collect hardware profile data 180 when the system is run. According to an embodiment of the present invention, the hardware profile data 180 may be stored in registers on the target device. In an alternate embodiment of the present invention, instead of collecting hardware profile data 180 from the programmed target device, hardware profile data 180 may be collected by executing the HDL or program file of the system on a simulator. In this embodiment, hardware need not be added during high-level compilation 120 to collect the hardware profile data 180.

During a second iteration of the high-level compilation 120, the report files 150 and hardware profile data 180 are used to perform profile guided optimization of the design of the system. By performing profile guided optimization using profile data from an earlier compilation of the system, an improved HDL of the design of the system may be generated. During the second iteration of the high-level compilation, hardware need not be included to further collect hardware profile data.

Figure 2:
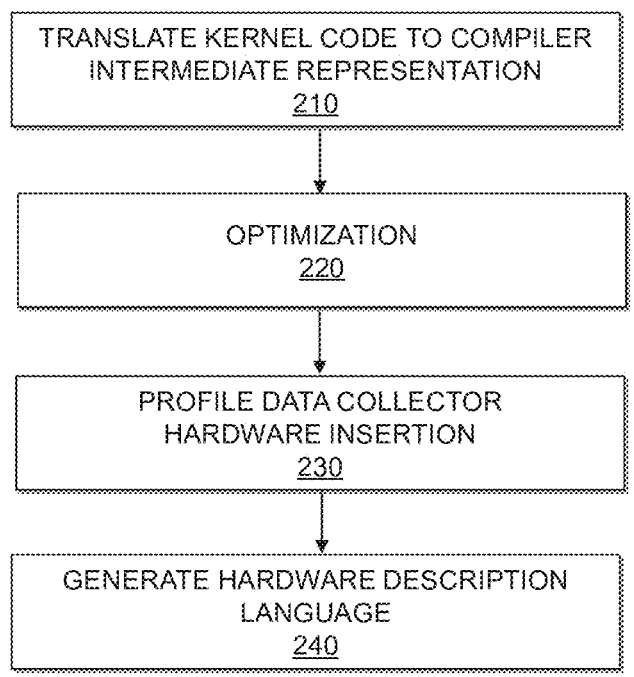
FIG. 2 is a flow chart illustrating a first iteration of performing high-level compilation according to an embodiment of the present invention.

FIG. 2 is a flow chart illustrating a method for performing a first iteration of high-level compilation according to an embodiment of the present invention. According to an embodiment of the present invention, the procedures shown in FIG. 2 may be used to implement procedure 120 (shown in FIG. 1) in part. At 210, kernel code is translated to compiler intermediate representation. According to an embodiment of the present invention, the compiler intermediate representation of the kernel code includes a sequence of functions and a named data storage. Each function is a sequence of instructions grouped into basic blocks. A basic block is a contiguous sequence of instructions with one entry point and one exit point. An instruction in the middle of a basic block may be a function call, but may not count as an exit point from the basic block. Each basic block terminates with either (1) branch (possibly conditional), or (2) a return from the function. A barrier synchronization primitive is expressed as a function call to a special barrier function. The kernel code also includes a system description of the eventual hardware target system implemented. According to an embodiment of the present invention, the translation may be performed by a compiler front end.

At 220, the compiler intermediate representation is transformed and optimized by mapping it to hardware constructs. According to an embodiment of the present invention, a Static Single Assignment (SSA) is used to further restrict the compiler intermediate representation. In SSA, computed values are given a name, and the instruction that computes the value is referred to as the value's definition site. A value is computed so that it can be used by instructions that execute later in the program code, and each of those later instructions is a known as a use of the value.

At 230, hardware is added to the system to collect hardware profile data.

At 240, HDL is generated for the design of the system. The HDL describes the operation of the system to be programmed on the target device. The HDL description provides high-level representations of a circuit in terms of the flow of signals (or transfer of data) between hardware registers, and the logic operations performed on those signals.

Figure 3:
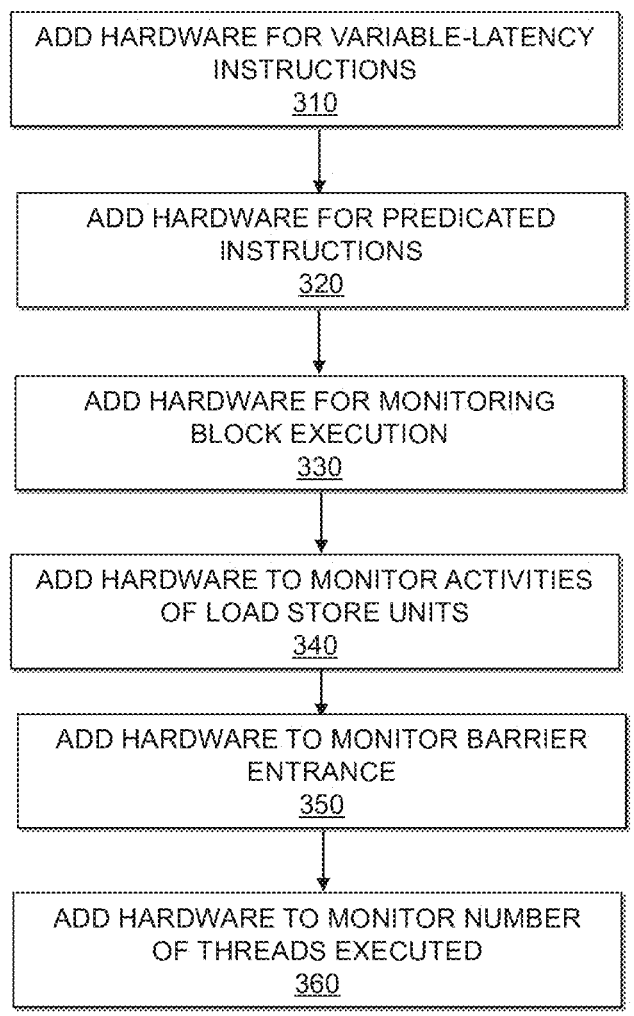
FIG. 3 is a flow chart illustrating a method for adding hardware during high-level compilation for collecting profile data according to an embodiment of the present invention.

FIG. 3 is a flow chart illustrating a method for adding hardware during high-level compilation for collecting profile data according to an embodiment of the present invention. According to an embodiment of the present invention, the procedures illustrated in FIG. 3 may be used to implement procedure 230 shown in FIG. 2. At 310, hardware is added for variable latency instructions. A variable-latency instruction is an instruction that may take a variable time to complete, depending on its inputs and the overall state of the system. According to an embodiment of the present invention, counters may be added to track the latency of one or more variable latency instructions. For example, a first counter may generate a value, lmax, that reflects a maximum latency of a variable latency instruction, and a second counter may generate a value, lmin, that reflects a minimum latency of the variable latency instruction.

At 320, hardware is added for predicated instructions. A predicated instruction is an instruction that does not do anything if one of its inputs, the predicate (a Boolean argument), is false. According to an embodiment of the present invention, a counter may be added to keep track of a value, lena, which reflects a number of threads for which the predicate is true for the given instruction.

At 330, hardware is added for monitoring block execution. A block may include a set of instructions or hardware implementing the set instructions with no branching between the set of instructions/hardware. According to an embodiment of the present invention, a counter may be added to generate a value, Bctr, which reflects how many threads execute a block or how many times the block is executed.

At 340, hardware is added for monitoring activities of load store units (LSUs). An LSU is an instruction or corresponding hardware implementing an instruction that reads or writes a single value from a specified address in memory. According to an embodiment of the present invention, for every LSU, a first counter and second counter is added to track values, LSUmax and LSUmin, which reflect a maximum and a minimum address value accessed by the LSU. A third counter is added to track a value, LSUstall, which reflects a number of cycles the LSU is stalled. A fourth counter is added to track a value, LSUactive, which reflects a number of cycles the LSU is active. A fifth counter is added to track a value, LSUidle, which reflects a number of cycles that LSU is idle. A sixth counter and a seventh counter are added to track values, LSUcache_hit and LSUcache_miss, which reflect cache hits and cache misses to the LSUs that use caches.

At 350, hardware is added for monitoring a barrier entrance. A barrier is a construct that requires all threads to enter the barrier before any thread can exit it. A simple barrier is used when threads do not use IDs to make control flow decisions. A re-ordering barrier is used when threads do use their IDs for control flow decisions, allowing threads to enter the barrier out of order. According to an embodiment of the present invention, for every re-ordering barrier, a bit, BARord, is kept and set to 1 if all instructions enter the re-ordering barrier in order and set to 0 if not all instructions enter the-reordering barrier in order.

At 360, hardware is added for monitoring a number of threads executed. A thread is a set of inputs to a kernel. According to an embodiment of the present invention, a counter may be added to generate a value, #Threads, which reflects a number of threads executed.

It should be appreciated that additional hardware may be implemented to collect additional hardware profile data.

Figure 4:
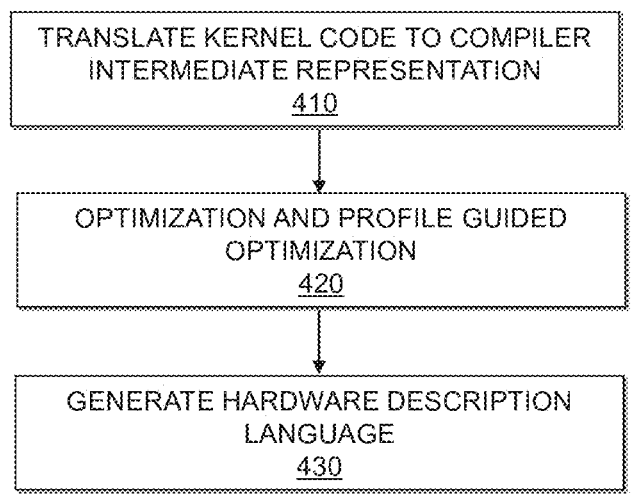
FIG. 4 is a flow chart illustrating a second iteration of high-level compilation according to an embodiment of the present invention.

FIG. 4 is a flow chart illustrating a second iteration of high-level compilation according to an embodiment of the present invention. According to an embodiment of the present invention, the procedures shown in FIG. 4 may be used to implement procedure 120 (shown in FIG. 1) in part.

At 410, kernel code is translated to compiler intermediate representation. According to an embodiment of the present invention, the compiler intermediate representation of the kernel code includes a sequence of functions and a named data storage. Each function is a sequence of instructions grouped into basic blocks. A basic block is a contiguous sequence of instructions with one entry point and one exit point. An instruction in the middle of a basic block may be a function call, but may not count as an exit point from the basic block. Each basic block terminates with either (1) branch (possibly conditional), or (2) a return from the function. A barrier synchronization primitive is expressed as a function call to a special barrier function. The kernel code also includes a system description of the eventual hardware target system implemented. According to an embodiment of the present invention, the translation may be performed by a compiler front end.

At 420, the compiler intermediate representation is transformed and optimized by mapping it to hardware constructs. In addition, profile guided optimization is performed using profile data associated with an earlier compilation of the design of the system. The profile data may include report files from an earlier HDL compilation of the system and/or hardware profile data from the earlier compiled system.

At 430, HDL is generated for the design of the system. The HDL describes the operation of the system to be programmed on the target device. The HDL description provides high-level representations of a circuit in terms of the flow of signals (or transfer of data) between hardware registers, and the logic operations performed on those signals.

Figure 5:
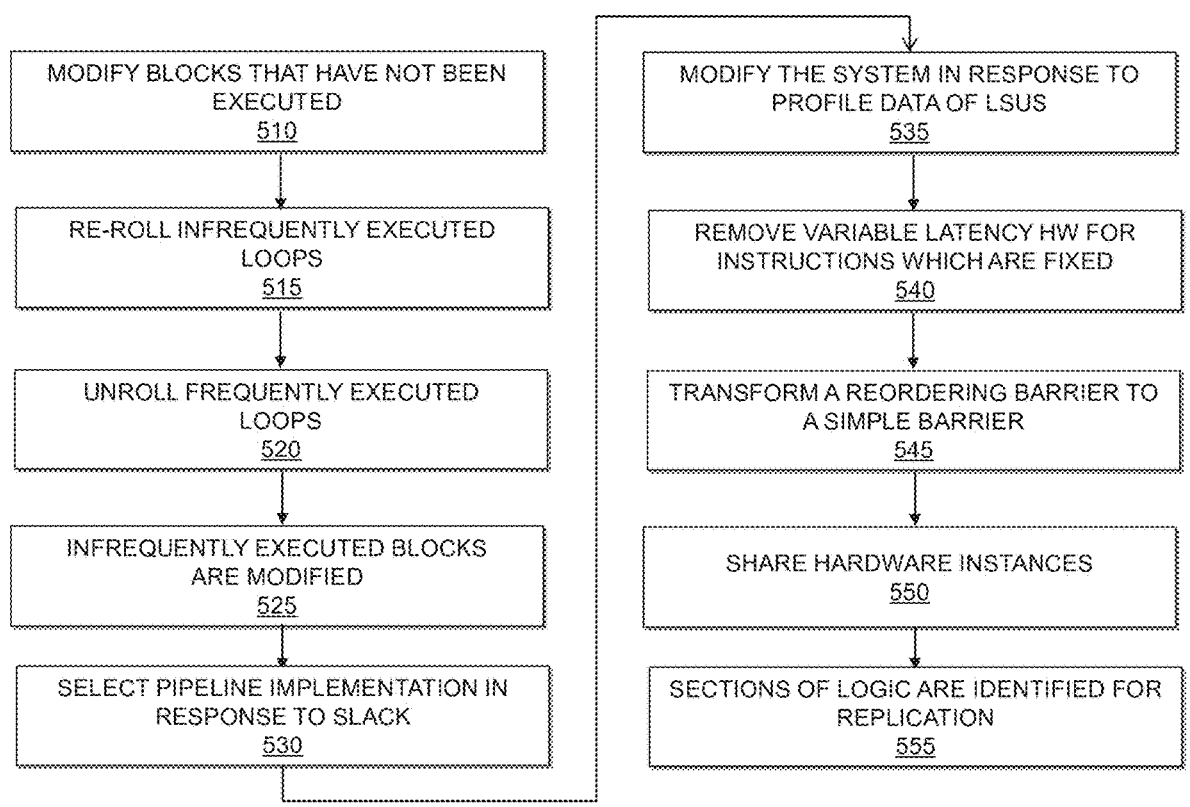
FIG. 5 is a flow chart illustrating a method for performing optimization with profile data during high-level compilation according to an embodiment of the present invention.

FIG. 5 is a flow chart illustrating a method for performing optimization with profile data during high-level compilation according to an embodiment of the present invention. The procedures illustrated in FIG. 5 may be used to implement procedure 420 (shown in FIG. 4) in part. At 510, blocks that are identified as never being executed are modified. When Bctr has a value of zero, this indicates that no threads have executed this block during a run of the system. In view of this, the system may be optimized a number of ways. According to an embodiment of the present invention, the block may be implemented in an area-efficient manner disregarding any throughput requirements or optimizations. Timing constraints associated with this block may be relaxed in order to prevent optimizing hardware in the block. Alternatively, hardware associated with the block may be completely removed. If the block represents an entire kernel, all the sub-blocks inside may be removed. According to an embodiment of the present invention, removal of hardware associated with a block having a Bctr value of zero may be classified as an unsafe optimization.

At 515, loops identified as being infrequently executed are re-rolled. According to an embodiment of the present invention, a loop may be identified as being infrequently executed if the block counter value for the first block inside the loop, Bctr, divided by the number of threads executed by a system over a given time, #Threads, is less than a control value, LoopFreqCutoff. The control value may be a user or compiler assigned value less than 1. Loop re-rolling transforms two or more consecutive blocks with the same functionality to a loop containing a single block of with the same functionality. The resulting loop with the single block will produce the same result as the original two or more blocks that were re-rolled. Re-rolling may also be applied to an existing loop having two or more consecutive blocks with the same functionality. In this case, the re-rolling will transform the existing loop by replacing the two consecutive blocks with a single block and increase the iteration count of the loop to produce the same result.

At 520, loops identified as being frequently executed are unrolled. According to an embodiment of the present invention, a loop may be identified as being frequently executed if the block counter value, Bctr, of the first block in the loop body divided by the number of threads executed by a system over a given time, #Threads, is greater than LoopFreqCutoff. Loop unrolling involves fully or partially replacing a loop body with a repeating sequence of blocks that include the original loop body without changing the functionality of the overall program.

At 525, infrequently executed blocks are implemented in an area-efficient manner. The frequency of execution of a block may be evaluated by observing the Bctr value corresponding to the block. According to an embodiment of the present invention, an infrequently executed block at the beginning of a kernel may be pre-computed on the host and its output put into memory. This removes the area required for the block on the target device and only adds an LSU to re-populate the data inside registers on the target device. Alternatively, a lower-area, higher-latency implementation for the infrequently executed block may be selected. Another alternative for implementing the infrequently executed block is to utilize a soft CPU on the target device to perform the block's computations. This would be advantageous if the area for the soft CPU is smaller than the area for the block and the performance of the soft CPU is not limiting the performance of the system.

At 530, a pipeline implementation is selected in response to the worst slack value associated with a section. According to an embodiment of the present invention, for instructions associated with a section of the system having a small lslack value, a higher pipelined implementation is selected for the section. On the contrary, for instructions associated with a section of the system having a large lslack value, a lower pipelined implementation is selected for the section. Pipelining may involve breaking up hardware implementation into multiple stages, each separated by registers. Each stage may be executing a computation for a different thread. An instruction implemented with two sets of pipelining registers can process three threads at the same time. An instruction implemented without pipelining can process only a single thread at a time. Determining whether a lslack value is small or large may be achieved by comparing the value with a second control value assigned by either a user or compiler.

At 535, the design of the system may be modified in response to profile data of LSUs. According to an embodiment of the present invention, a cache size is selected or adjusted in response to profile data on its corresponding LSU. In this embodiment, the values for LSUcache_hit, LSUcache_miss, LSU_max, and LSUmin may be used to guide cache size selection. According to an embodiment of the present invention, the ratio of LSUcache_hit/(LSUcache_hit+LSUcache_miss) may be used to determine an existing cache's effectiveness. If the ratio is low compared to a third control value, the size of the cache may be increased to be comparable to (LSUmax−LSUmin). If the ratio is high compared to the third control value, the cache size may be decreased to be comparable to (LSUmax−LSUmin). If an LSU does not have an existing cache and is a random access LSU, a cache may be instantiated with a size comparable to (LSUmax−LSUmin). If multiple LSUs have caches, but the LSUs access data from over-lapping ranges, the caches may be configured to be shared among the LSUs.

According to an embodiment of the present invention, global and local memory architectures are adjusted in response to profile data on a corresponding LSU. In this embodiment, LSUmax and LSUmin are used to determine which global and local memory banks a LSU is accessing. This information is used to arbitrate networks for the local and global memory, and identify a number of banks and ports to allocate for the local memory. According to an embodiment of the present invention, adjusting global and local memory architectures in response to profile data on a corresponding LSU may be classified as an unsafe optimization.

According to an embodiment of the present invention, profile data corresponding to LSUs are used to determine which LSU alias. Aliasing involves pointing to overlapping memory ranges. According to an embodiment of the present invention, LSUmax and LSUmin are used to determine which LSUs alias. Using profile data on LSUs to determine which LSUs alias may be classified as an unsafe optimization.

According to an embodiment of the present invention, profile data corresponding to LSUs are used to allocate device memory. According to an embodiment frequently used LSUs should be allocated into different memory banks. The frequency in which an LSU is used may be determined by observing the values associated with LSUactive and LSUstall.

According to an embodiment of the present invention, LSUs identified to be frequently used have the memory they access striped across multiple memory banks to increase effective memory bandwidth. Striping data across multiple memory banks may involve putting consecutive chunks of data into two or more alternating memory banks. For example, striping across two memory banks puts a first kilobyte of data into bank 0, a second kilobyte of data into bank 1, a third kilobyte of data into bank 0, and so on.

At 540, for variable latency instructions in a basic block having fixed latency, control logic associated with the variable latency is removed. According to an embodiment of the present invention, a variable latency instruction which has its lmax value equal to its lmin value may be interpreted as being a fixed latency instruction. The removal of control logic associated with the variable latency allows the system to save area and may increase the maximum frequency of the block which leads to better throughput. Removing the control logic may be classified as an unsafe optimization.

At 545, a reordering barrier is transformed to a simple barrier when instructions enter the reordering barrier in order. According to an embodiment of the present invention, the value for BARord may be observed to determine whether instructions have entered a reordering barrier in order. By transforming the reordering barrier to a simple barrier, the area for implementing the barrier on the target device is reduced. Transforming a reordering barrier to a simple barrier may be classified as an unsafe optimization.

At 550, instructions which are not enabled all of the time may share instances of hardware. According to an embodiment of the present invention, the value for lena may be observed to determine whether instructions are enabled most of the time. If the instructions are not enabled most of the time, the instructions may share a single hardware instance among multiple calls. Hardware sharing may be achieved by having multiple call sites make requests to the hardware instance to perform the computation. The requests are arbitrated to ensure that they are serviced at a rate supported by the hardware instance. If the requests are made quicker than they can be serviced, the call sites making the requests are told to wait for the answer.

At 555, sections of logic are identified for replication. Replicating a section of logic is advantageous only if the performance of the section is not limited by accesses to global memory. The number of copies to replicate the section of logic may be guided by the maximum stall ratio of the LSUs within the section and the hardware area used by the section. The stall ratio may be calculated as max (LSUstall/LSUactive), where max is taken over all LSUs in the section. Generating 1/(stall ratio) copies of the section of logic will create a system with stall ratio close to 1, meaning that the worst LSU is stalling as often as it is active. Section area may provide another limit to the number of possible copies that can be created as the number of copies may be no greater than (available FPGA area)/(section area). It should be appreciated that other parameters may also limit the useful number of copies that can be created by replication.

The optimizations described with reference to FIG. 5 describe only exemplary optimizations that may be performed with exemplary profile data. It should be appreciated that other optimizations may be performed using the described or other profile data.

Some of the optimizations described with reference to FIG. 5 may lead to noticeable area reduction and performance gains. However, some of the optimization procedures are classified as unsafe because when different input data is used the optimizations may lead to an incorrect operation of the hardware implemented on the target device. In order to determine whether to implement an unsafe optimization, a user interface may be implemented to allow a user to select an unsafe optimization and for recording the decision for future users. According to an embodiment of the present invention, the user interface may describe unsafe optimizations in terms that refer to a high-level description written by the user, describe the benefits and costs of applying an optimization, requests a decision as to whether to execute an optimization, and record the decision. According to an embodiment of the present invention, the decisions made by the user and optimizations performed by the high-level compiler may be documented in the computer language description.

Figure 6:
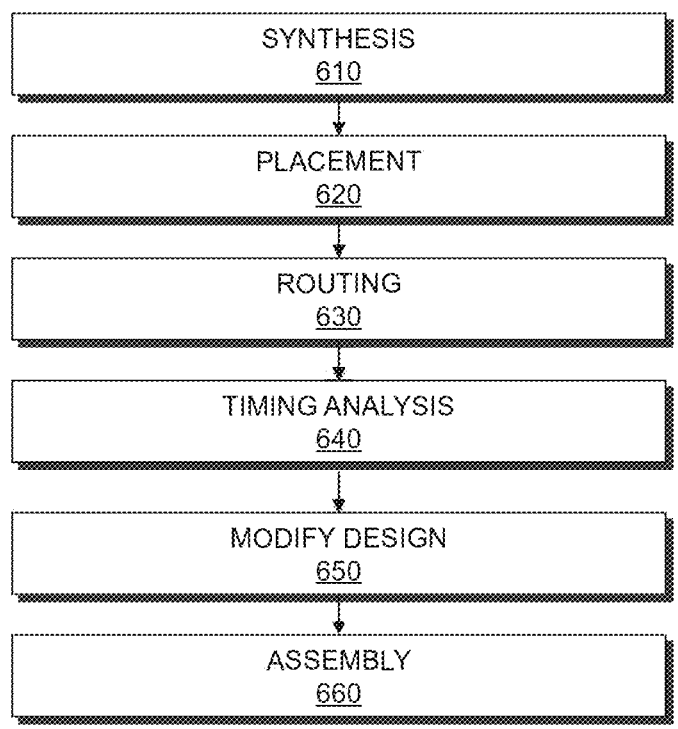
FIG. 6 is a flow chart illustrating a method for performing HDL compilation according to an embodiment of the present invention.

FIG. 6 is a flow chart illustrating a method for performing HDL compilation according to an embodiment of the present invention. According to an embodiment of the present invention, the procedures illustrated in FIG. 6 may be used to implement procedure 140 shown in FIG. 1. At 610, the system is synthesized. Synthesis includes generating a logic design of the system to be implemented by the target device. According to an embodiment of the present invention, synthesis generates an optimized logical representation of the system from an HDL design definition. Synthesis also includes mapping the optimized logic design. Mapping includes determining how to implement logic gates and logic elements in the optimized logic representation with specific resources on the target device. According to an embodiment of the present invention, a netlist is generated from mapping. This netlist may be an optimized technology-mapped netlist generated from the HDL.

At 620, the system is placed. According to an embodiment of the present invention, placement involves placing the mapped logical system design on the target device. Placement works on the technology-mapped netlist to produce a placement for each of the functional blocks. According to an embodiment of the present invention, placement includes fitting the system on the target device by determining which resources on the logic device are to be used for specific logic elements, and other function blocks, determined to implement the system during synthesis. Placement may include clustering which involves grouping logic elements together to form the logic clusters present on the target device. According to an embodiment of the present invention, clustering is performed at an early stage of placement and occurs directly after synthesis during the placement preparation stage.

At 630, the placed design is routed. During routing, routing resources on the target device are allocated to provide interconnections between logic gates, logic elements, and other components on the target device. Routability optimization may also be performed on the placed logic design. According to an embodiment of the present invention, the goal of routability optimization is to reduce the amount of wiring used to connect components in the placed logic design. Routability optimization may include performing fanout splitting, logic duplication, logical rewiring, or other procedures. It should be appreciated that one or more of the procedures may be performed on the placed logic design.

At 640, timing analysis is performed on the system designed by procedures 610, 620, and 630. According to an embodiment of the present invention, the timing analysis determines whether timing constraints of the system are satisfied. As part of timing analysis, slack analysis may be performed.

At 650, the design for the system is modified in response to the timing analysis. According to an embodiment of the present invention, the design for the system may be modified in response to determining that timing constraints have not been satisfied. The design for the system may be modified by a designer manually or alternatively the design may be modified automatically by the EDA tool by re-executing one or more of procedures 610, 620, and 630. It should also be appreciated that each procedure may perform this optimization in its first invocation by performing the analysis during its execution. Timing analysis 640 may be performed after the system is modified to collect statistics of the modified design of the system.

At 660, an assembly procedure is performed. The assembly procedure involves creating a program file that includes information determined by the procedures described at 610, 620, 630, 640, and 650. The program file may be a bit stream that may be used to program a target device. According to an embodiment of the present invention, the procedures illustrated in FIG. 6 may be performed by an EDA tool executed on a first computer system. The data file generated may be transmitted to a second computer system to allow the design of the system to be further processed. Alternatively, the data file may be transmitted to a second computer system which may be used to program the target device according to the system design. It should be appreciated that the design of the system may also be output in other forms such as on a display device or other medium. The target device may be programmed with the data file. By programming the target with the data file, components on the target device are physically transformed to implement the system.

FIGS. 1-6 are flow charts that illustrate embodiments of the present invention. The procedures described in these figures may be performed by an EDA tool implemented by a computer system. Some of the techniques illustrated may be performed sequentially, in parallel or in an order other than that which is described and that the procedures described may be repeated. It is appreciated that not all of the techniques described are required to be performed, that additional techniques may be added, and that some of the illustrated techniques may be substituted with other techniques.

Figure 7:
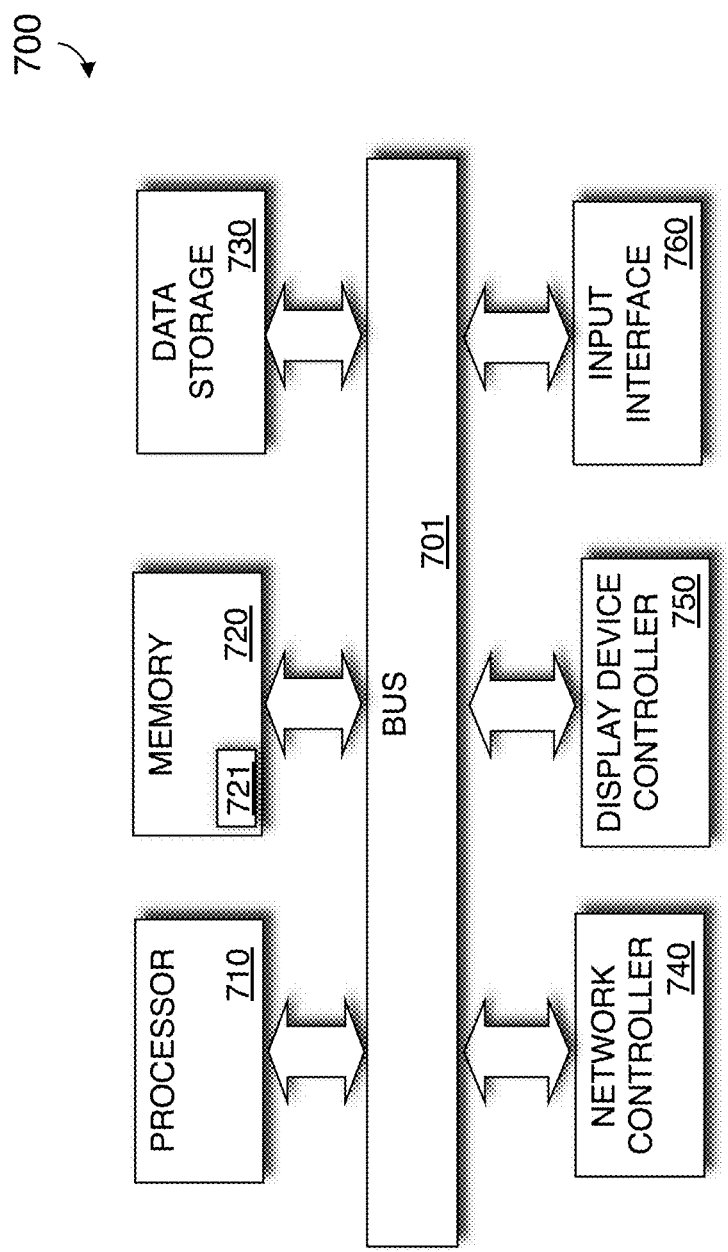
FIG. 7 illustrates a block diagram of a computer system implementing a system designer according to an embodiment of the present invention.

FIG. 7 is a block diagram of an exemplary computer system 700 in which an example embodiment of the present invention resides. The computer system 700 includes a processor 710 that process data signals. The processor 710 is coupled to a bus 701 or other switch fabric that transmits data signals between processor 710 and other components in the computer system 700. The computer system 700 includes a memory 720. The memory 720 may store instructions and code represented by data signals that may be executed by the processor 710. A data storage device 730 is also coupled to the bus 701

A network controller 740 is coupled to the bus 701. The network controller 740 may link the computer system 700 to a network of computers (not shown) and supports communication among the machines. A display device controller 750 is coupled to the bus 701. The display device controller 750 allows coupling of a display device (not shown) to the computer system 700 and acts as an interface between the display device and the computer system 700. An input interface 760 is coupled to the bus 701. The input interface 760 allows coupling of an input device (not shown) to the computer system 700 and transmits data signals from the input device to the computer system 700.

A system designer 721 may reside in the memory 720 and be executed by the processor 710. The system designer 721 may operate to perform high-level compilation, HDL compilation, and program a target device. During a first iteration of high-level compilation, the system designer 721 may insert hardware used for collecting hardware profile data. During a second iteration of the high-level compilation, the system designer may perform profile guided optimization utilizing hardware profile data collected for an earlier compilation of the system and from report files generated from an earlier HDL compilation of the system.

Figure 8:
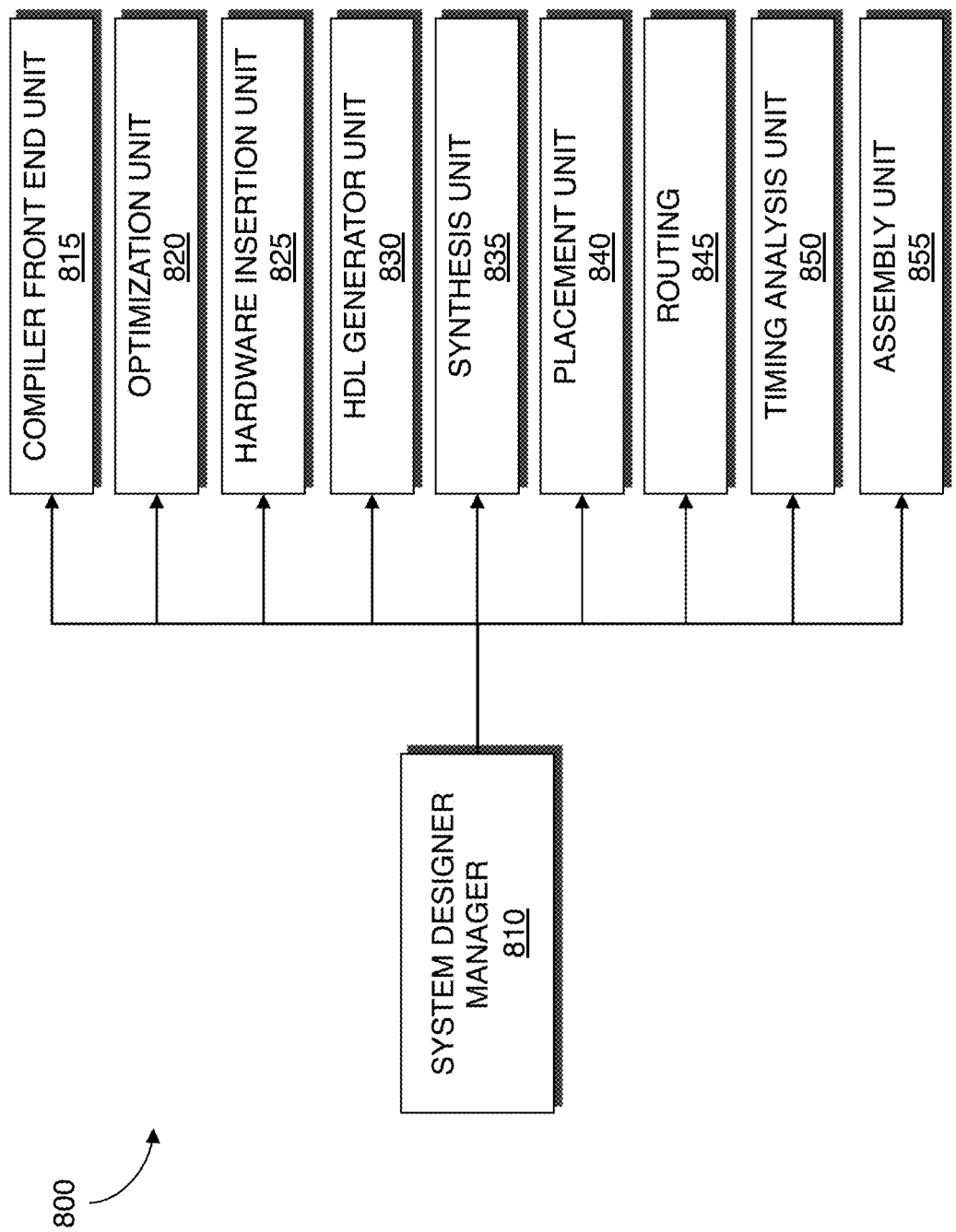
FIG. 8 is a block diagram of a system designer according to an embodiment of the present invention.

FIG. 8 illustrates a system designer 800 according to an embodiment of the present invention. The system designer 800 may be an EDA tool for designing a system on a target device such as an FPGA, structured application-specific integrated circuit (ASIC), ASIC, or other circuitry. FIG. 8 illustrates modules implementing an embodiment of the system designer 800. According to one embodiment, the modules represent software modules and system design may be performed by a computer system such as the one illustrated in FIG. 7 executing sequences of instructions represented by the modules shown in FIG. 8. Execution of the sequences of instructions causes the computer system to support system design as will be described hereafter. In alternate embodiments, hard-wire circuitry may be used in place of or in combination with software instructions to implement embodiments of present invention. Thus, embodiments of present invention are not limited to any specific combination of hardware circuitry and software.

The system designer 800 includes a designer manager 810. The designer manager 810 is connected to and transmits data between the components of the system designer 800.

The system designer 800 includes a compiler front end unit 815. The compiler front end unit 815 receives kernel code, which is a computer language description of the system, and translates the kernel code to a compiler intermediate representation.

The system designer 800 includes an optimization unit 820. The optimization unit 820 transforms and optimizes the compiler intermediate representation by mapping it to hardware constructs. During a second iteration of high-level compilation, the optimization unit 820 utilizes profile data of an earlier compilation of the system to perform profile guided optimizations as described with reference to FIG. 5. According to an embodiment of the present invention, the profile data may include hardware profile data collected from operation of the system as implemented on a target device and/or program files describing aspects of the system after timing analyzing.

The system designer 800 includes a hardware insertion unit 825. The hardware insertion unit 830 adds hardware to the system to collect hardware profile data when the system is implemented on a target device and in operation.

The system designer 800 includes a HDL generator unit 830. The HDL generator generates HDL for the design of the system. The HDL describes the operation of the system to be programmed on the target device. The HDL description provides high-level representations of a circuit in terms of the flow of signals (or transfer of data) between hardware registers, and the logic operations performed on those signals.

The system designer 800 includes a synthesis unit 835 that performs synthesis. The synthesis unit 835 generates a logic design of a system to be implemented on the target device. According to an embodiment of the system designer 800, the synthesis unit 835 takes a conceptual HDL design definition and generates an optimized logical representation of the system. The optimized logical representation of the system generated by the synthesis unit 835 may include a representation that has a reduced number of functional blocks and registers, such as logic gates and logic elements, required for the system. Alternatively, the optimized logical representation of the system generated by the synthesis unit 835 may include a representation that has a reduced depth of logic and that generates a lower signal propagation delay.

The synthesis unit 835 also performs technology mapping. Technology mapping involves determining how to implement the functional blocks and registers in the optimized logic representation utilizing specific resources such as cells on a target device thus creating an optimized "technology-mapped" netlist. The technology-mapped netlist illustrates how the resources (cells) on the target device are utilized to implement the system. In an embodiment where the target device is an FPGA, the technology-mapped netlist may include cells such as logic array blocks (LABs), registers, memory blocks, digital signal processing (DSP) blocks, input output (JO) elements or other components.

The system designer 800 includes a placement unit 840 that processes the optimized technology-mapped netlist to produce a placement for each of the functional blocks. The placement identifies which components or areas on the target device are to be used for specific functional blocks and registers.

The system designer 800 includes a routing unit 845 that performs routing. The routing unit 845 determines the routing resources on the target device to use to provide interconnection between the components implementing functional blocks and registers of the logic design.

The system designer 800 includes a timing analysis unit 850 that performs timing analysis to determine whether timing constraints of the system are satisfied. The timing analysis unit 850 may generate report files which identify the area required for implementing the system on the target device, the largest slack value for a path in a section of the system, and other statistics.

The system designer 800 includes an assembly unit 855 that performs an assembly procedure that creates a data file that includes the design of the system generated by the system designer 800. The data file may be a bit stream that may be used to program the target device. The assembly unit 855 may output the data file so that the data file may be stored or alternatively transmitted to a separate machine used to program the target device. It should be appreciated that the assembly unit 855 may also output the design of the system in other forms such as on a display device or other medium.

It should be appreciated that embodiments of the present invention may be provided as a computer program product, or software, that may include a computer-readable or machine-readable medium having instructions. The instructions on the computer-readable or machine-readable medium may be used to program a computer system or other electronic device. The machine-readable medium may include, but is not limited to, floppy diskettes, optical disks, CD-ROMs, and magneto-optical disks or other type of media/machine-readable medium suitable for storing electronic instructions. The techniques described herein are not limited to any particular software configuration. They may find applicability in any computing or processing environment. The terms "computer-readable medium" or "machine-readable medium" used herein shall include any medium that is capable of storing or encoding a sequence of instructions for execution by the computer and that cause the computer to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

Figure 9:
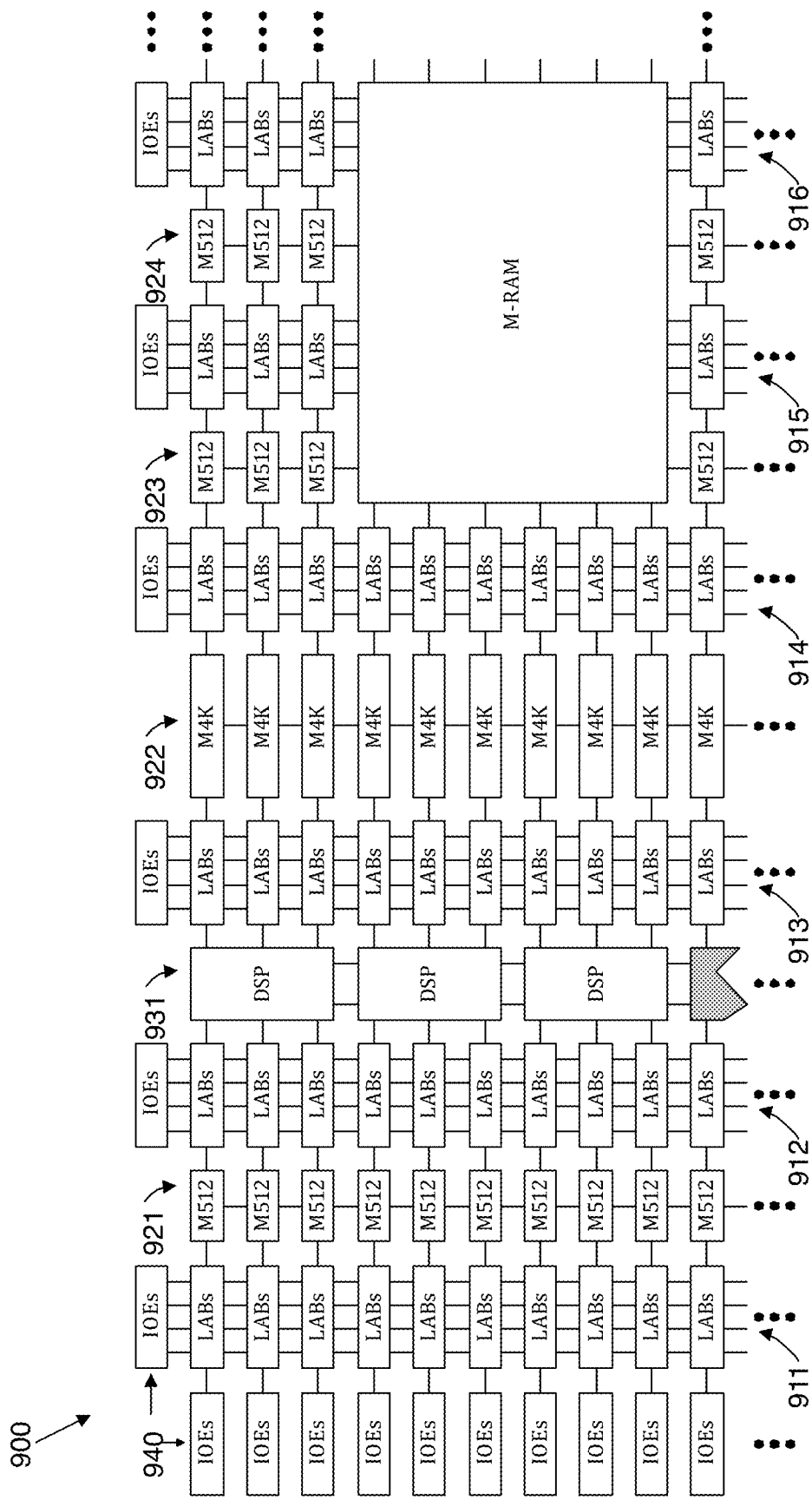
FIG. 9 illustrates an exemplary target device according to an embodiment of the present invention.

FIG. 9 illustrates a device 900 that may be used to implement a target device according to an embodiment of the present invention. The device 900 is a field programmable gate array (FPGA) that includes a plurality of logic-array blocks (LABs). Each LAB may be formed from a plurality of logic blocks, carry chains, LAB control signals, look up table (LUT) chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in the Stratix or Cyclone devices manufactured by Altera® Corporation, or a combinational logic block (CLB) such as those found in Virtex devices manufactured by Xilinx Inc. In this embodiment, the logic block may include a four input LUT with a configurable register. According to an alternate embodiment of the present invention, the logic block may operate similarly to an adaptive logic module (ALM), such as those found in Stratix devices manufactured by Altera Corporation. LABs are grouped into rows and columns across the device 900. Columns of LABs are shown as 911-916. It should be appreciated that the logic block may include additional or alternate components.

The device 900 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the device in between selected LABs or located individually or in pairs within the device 900. Columns of memory blocks are shown as 921-924.

The device 900 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the device 900 and are shown as 931.

The device 900 includes a plurality of input/output elements (IOEs) 940. Each IOE feeds an IO pin (not shown) on the device 900. The IOEs 940 are located at the end of LAB rows and columns around the periphery of the device 900. Each IOE may include a bidirectional IO buffer and a plurality of registers for registering input, output, and output-enable signals.

The device 900 may include routing resources such as LAB local interconnect lines, row interconnect lines ("H-type wires"), and column interconnect lines ("V-type wires") (not shown) to route signals between components on the target device.

In the foregoing specification, embodiments of the invention have been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A method for designing a system on a target device, comprising:
    performing a high-level compilation of a computer program language description of the system to generate a hardware description language (HDL) of the system, wherein the high-level compilation adds a description of hardware that collects profile data, to be implemented by the target device, to the HDL of the system, wherein the profile data comprises a number of threads which execute an identified block of logic in the system over a period of time, wherein the profile data further comprises operating parameters of a load store unit implemented in the system that comprises an instruction that reads or writes a value from an address in memory, and wherein performing the high-level compilation further comprises tracking values that reflect maximum and minimum address values accessed by the load store unit using first and second counters; and
    generating a data file from the HDL of the system including the added description of the hardware that collects the profile data; and
    programming the target device with the data file to physically transform components on the target device to implement the system.

2. The method of claim 1, wherein the profile data comprises hardware profile data of the system implemented on the target device from an earlier HDL compilation of the system.

3. The method of claim 1, wherein the profile data comprises hardware profile data of the system obtained by performing a simulation of an earlier HDL compilation of the system.

4. The method of claim 1, wherein the profile data comprises report files generated by an earlier HDL compilation of the system.

5. The method of claim 1, wherein the profile data comprises minimum and maximum latency values associated with variable latency instructions executed by the system.

6. The method of claim 1, wherein the profile data comprises a number of threads enabled for predicated instructions executed by the system over a period of time.

7. The method of claim 1, wherein the profile data comprises an indication of whether instructions enter a barrier in order.

8. The method of claim 1, wherein the profile data comprises a value as to a number of threads executed by the system over a period of time.

9. The method of claim 1, wherein the profile data comprises an area on the target device required to implement the system.

10. The method of claim 1, wherein the profile data comprises a worst slack value for the system.

11. The method of claim 1 further comprising:
    presenting optimization options and costs and benefits associated with the optimization options on a graphical user interface; and
    performing an optimization option responsive to a user selecting the optimization option.

12. The method of claim 1, wherein the description of the hardware added is implemented on the target device.

13. A non-transitory computer readable medium including a sequence of instructions stored thereon for causing a computer to execute a method, comprising:
    performing a high-level compilation of a computer program language description of a system to generate a hardware description language (HDL) of the system, wherein the high-level compilation adds a description of hardware for collecting hardware profile data, to be implemented by a target device, used for future high-level compilation of the system to the HDL of the system, wherein the hardware profile data comprises operating parameters of a load store unit that comprises an instruction that reads or writes a value from an address in memory, wherein performing the high-level compilation further comprises tracking a value that reflects a number of cycles that the load store unit is active using a first counter, tracking a value that reflects a number of cycles that the load store unit is idle using a second counter, and tracking a value that reflects a number of cycles that the load store unit is stalled using a third counter;

generating a data file from the HDL of the system including the added description of the hardware that collects the hardware profile data;

programming a target device with the data file to physically transform components on the target device to implement the system;

uploading the hardware profile data from the target device implementing the system; and performing a second high-level compilation of the computer program language description of the system to generate a second hardware description language (HDL) of the system, wherein the second high-level compilation performs optimizations in response to the hardware profile data, wherein the optimizations comprises relaxing timing constraint for signals associated with a block of logic identified as not being used from the hardware profile data.

14. The non-transitory computer readable medium of claim 13, wherein the method further comprises:

compiling the HDL to generate a programming file to program a target device to implement the system; and generating report files from timing analysis of the compiled HDL.

15. The non-transitory computer readable medium of claim 13, wherein the optimizations comprise removing hardware associated with an unused block of logic in response to information provided from the hardware profile data.

16. The non-transitory computer readable medium of claim 13, wherein the high-level compilation is performed prior to HDL compilation of the system.

17. The non-transitory computer readable medium of claim 13, wherein the description of the hardware added is implemented on the target device.

18. A non-transitory computer readable medium including a sequence of instructions stored thereon for causing a computer to execute a method for designing a system, comprising:

performing high-level compilation of a computer program language description of the system to generate a hardware description language (HDL) of the system, wherein performing the high-level compilation comprises adding a description of hardware for collecting hardware profile data, to be implemented on a target device, used for future high-level compilation of the system to the HDL of the system, wherein the hardware profile data comprises operating parameters of a load store unit that comprises an instruction that reads or writes a value from an address in memory, and wherein performing the high-level compilation further comprises tracking values that reflect maximum and minimum address values accessed by the load store unit using first and second counters;

presenting a plurality of optimization options and costs and benefits associated with the optimization options on a graphical user interface, wherein an optimization option is performed responsive to a user selecting the optimization option, during a second high-level compilation of the computer program language description of the system to generate a second HDL of the system;

generating a data file that describes the system that has been optimized according to the optimization option; and programming a target device with the data file to physically transform components on the target device to implement the system.

19. The non-transitory computer readable medium of claim 18 further comprising:

synthesizing a logic design of the system from the HDL of the system;

placing the system on a target device;

routing the system on the target device; and evaluating the system on the target device and generating report files describing slack on a critical path.

20. The non-transitory computer readable medium of claim 19, wherein performing high-level compilation comprises performing the second high-level compilation of the computer program language description of the system to generate the second hardware description language (HDL) of the system, wherein the second high-level compilation performs optimizations in response to the hardware profile data and the report files.

21. The non-transitory computer readable medium of claim 18, wherein the second high-level compilation performs optimizations in response to the hardware profile data collected from hardware added during the high-level compilation.

* * * * *